United States Patent
Yu et al.

(10) Patent No.: US 11,984,900 B2
(45) Date of Patent: May 14, 2024

(54) TUNING VOLTAGE TRACKER FOR RECEIVE/TRANSMIT PHASE-LOCKED LOOP (PLL) FAST SWITCHING

(71) Applicant: QUALCOMM Incorporated, San Diego, CA (US)

(72) Inventors: Jianjun Yu, San Diego, CA (US); Yue Chao, San Diego, CA (US); Tomas O'Sullivan, San Diego, CA (US); Lai Kan Leung, San Marcos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/934,654

(22) Filed: Sep. 23, 2022

(65) Prior Publication Data

US 2024/0106442 A1    Mar. 28, 2024

(51) Int. Cl.
*H03L 7/099* (2006.01)
*H03B 5/12* (2006.01)
*H03K 3/0231* (2006.01)
*H03M 1/46* (2006.01)

(52) U.S. Cl.
CPC ............ *H03L 7/099* (2013.01); *H03B 5/1293* (2013.01); *H03K 3/0231* (2013.01); *H03M 1/46* (2013.01)

(58) Field of Classification Search
CPC ......................................................... H03L 7/099
USPC ......................................................... 327/156
See application file for complete search history.

(56) References Cited

U.S. PATENT DOCUMENTS

| 5,355,098 A | 10/1994 | Iwasaki |
| 7,831,007 B1 | 11/2010 | Mokhtari |
| 8,432,201 B1 | 4/2013 | Sinha et al. |
| 11,063,598 B1 | 7/2021 | Bao et al. |
| 2006/0119440 A1 | 6/2006 | Isobe et al. |
| 2011/0102031 A1* | 5/2011 | Kim .................. H03L 7/101 327/156 |

OTHER PUBLICATIONS

International Search Report and Written Opinion—PCT/US2023/073883—ISA/EPO—Jan. 5, 2024.

\* cited by examiner

*Primary Examiner* — Tomi Skibinski
(74) *Attorney, Agent, or Firm* — Patterson + Sheridan LLP

(57) ABSTRACT

Methods and apparatus for storing a control voltage of a phased-locked loop (PLL) when switching from mission mode to standby mode for the PLL, and for restoring the control voltage of the PLL when switching back to mission mode. An example PLL circuit includes a charge pump, a voltage-controlled oscillator (VCO) having a control input coupled to an output of the charge pump via a node, and a tracking circuit coupled to the node. The tracking circuit is generally configured to sample a voltage of the node during a mission mode, save a representation of the sampled voltage before entering a standby mode, and restore the sampled voltage to the node for reentering the mission mode using the saved representation of the sampled voltage.

18 Claims, 8 Drawing Sheets

TUNING VOLTAGE TRACKER FOR RECEIVE/TRANSMIT PHASE-LOCKED LOOP (PLL) FAST SWITCHING

TECHNICAL FIELD

Certain aspects of the present disclosure generally relate to electronic circuits and, more particularly, to phase-locked loops (PLLs).

BACKGROUND

Wireless communication devices are widely deployed to provide various communication services such as telephony, video, data, messaging, broadcasts, and so on. Such wireless communication devices may transmit and/or receive radio frequency (RF) signals via any of various suitable radio access technologies (RATs) including, but not limited to, 5G New Radio (NR), Long Term Evolution (LTE), Code Division Multiple Access (CDMA), Time Division Multiple Access (TDMA), Wideband CDMA (WCDMA), Global System for Mobility (GSM), Bluetooth, Bluetooth Low Energy (BLE), ZigBee, wireless local area network (WLAN) RATs (e.g., WiFi), and the like.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. The base station and/or mobile station may include at least one phase-locked loop (PLL), which may be used, for example, in a frequency synthesizer to generate and control a local oscillator (LO) signal for mixing with a baseband signal (or a radio frequency (RF) signal) for upconversion (or downconversion) to an intermediate frequency (IF) signal or an RF signal (or an IF signal or a baseband signal) before transmission (after reception).

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide advantages that include reduced initial frequency error of a phase-locked loop (PLL) when stopping and restarting the PLL, as well as faster PLL locking over temperature.

Certain aspects of the present disclosure provide a PLL circuit. The PLL circuit includes a charge pump, a voltage-controlled oscillator (VCO) having a control input coupled to an output of the charge pump via a node, and a tracking circuit coupled to the node. The tracking circuit is generally configured to sample a voltage of the node during a mission mode, save a representation of the sampled voltage before entering a standby mode, and restore the sampled voltage to the node for reentering the mission mode using the saved representation of the sampled voltage.

Certain aspects of the present disclosure provide a radio frequency (RF) transceiver circuit. The RF transceiver circuit generally includes a receive path, a receive phase-locked loop (RxPLL) coupled to the receive path, a transmit path, and a transmit phase-locked loop (TxPLL) coupled to the transmit path. At least one of the RxPLL or the TxPLL includes a charge pump, a VCO having a control input coupled to an output of the charge pump via a node, and a tracking circuit coupled to the node. The tracking circuit is generally configured to sample a voltage of the node during a mission mode, save a representation of the sampled voltage before entering a standby mode, and restore the sampled voltage to the node for reentering the mission mode using the saved representation of the sampled voltage.

Certain aspects of the present disclosure provide a method of wireless communication. The method generally includes operating a first PLL during a first mission mode for a first circuit path associated with the first PLL; sampling a control voltage of the first PLL during the first mission mode; saving a representation of the sampled control voltage of the first PLL before entering a first standby mode for the first circuit path; stopping operation of at least a portion of the first PLL during the first standby mode; and restoring the sampled control voltage to the first PLL for reentering the first mission mode using the saved representation of the sampled control voltage of the first PLL.

Certain aspects of the present disclosure provide an apparatus for wireless communication. The apparatus generally includes a PLL configured to operate during a mission mode for a circuit path associated with the PLL; means for sampling a control voltage of the PLL during the mission mode; means for saving a representation of the sampled control voltage of the PLL before entering a standby mode for the circuit path, wherein the PLL is further configured to stop operation during the standby mode; and means for restoring the sampled control voltage to the PLL for reentering the mission mode using the saved representation of the sampled control voltage.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure relate to techniques and apparatus for sampling and storing a control voltage (Vtune) of a phase-locked loop (PLL) as the PLL switches from mission mode to standby mode, and for restoring the control voltage as the PLL switches from standby mode back to mission mode. In this manner, when reentering mission mode, the PLL's initial frequency error may be reduced, the PLL may settle faster, and the PLL may exhibit lower temperature drift.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

Figure 1:
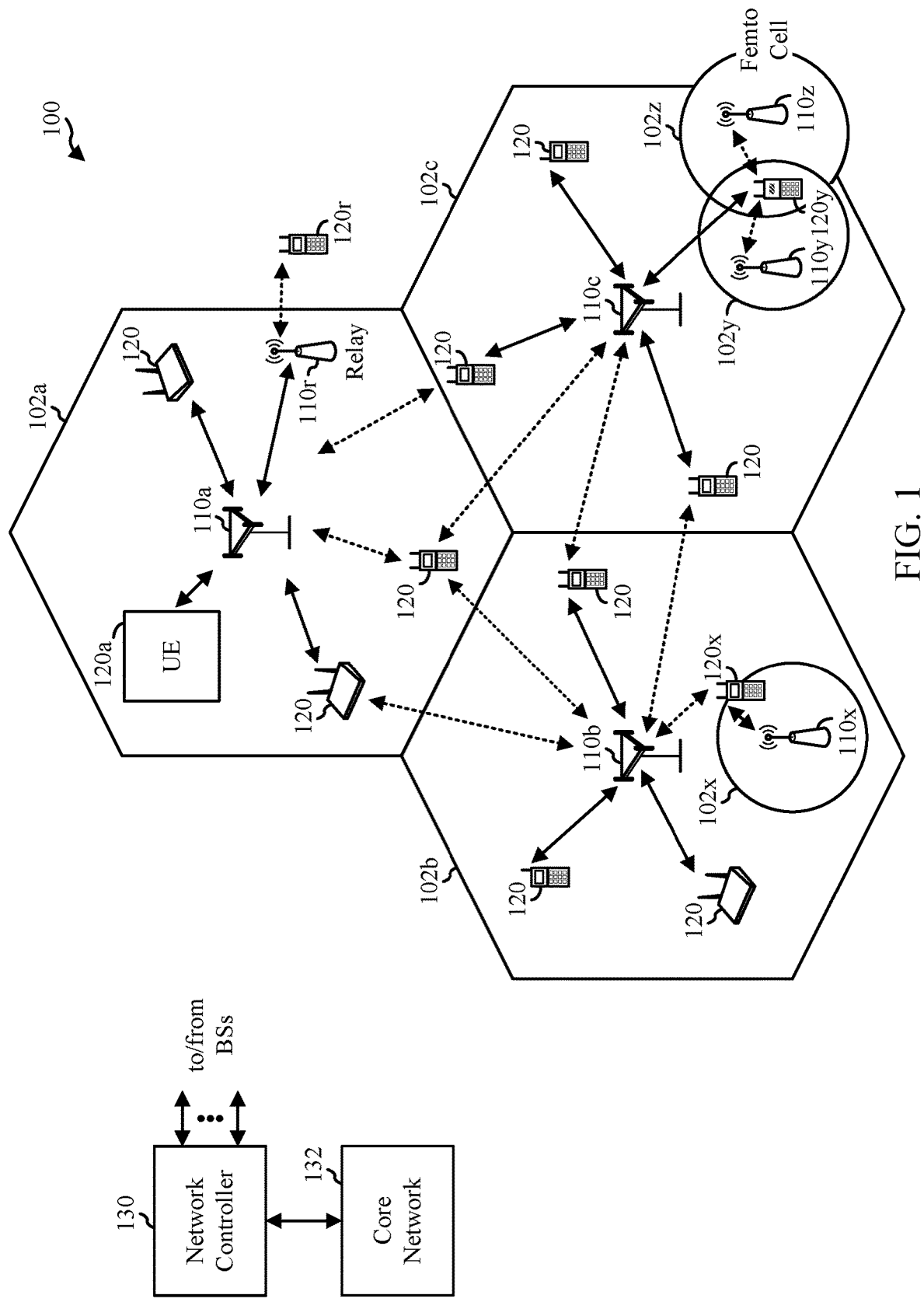
FIG. 1 is a diagram of an example wireless communications network, in which aspects of the present disclosure may be practiced.

FIG. 1 illustrates an example wireless communications network 100, in which aspects of the present disclosure may be practiced. For example, the wireless communications network 100 may be a New Radio (NR) system (e.g., a Fifth Generation (5G) NR network), an Evolved Universal Terrestrial Radio Access (E-UTRA) system (e.g., a Fourth Generation (4G) network), a Universal Mobile Telecommunications System (UMTS) (e.g., a Second Generation/Third Generation (2G/3G) network), or a code division multiple access (CDMA) system (e.g., a 2G/3G network), or may be configured for communications according to an IEEE standard such as one or more of the 802.11 standards, etc.

As illustrated in FIG. 1, the wireless communications network 100 may include a number of base stations (BSs) 110*a-z* (each also individually referred to herein as "BS 110" or collectively as "BSs 110") and other network entities. A BS may also be referred to as an access point (AP), an evolved Node B (eNodeB or eNB), a next generation Node B (gNodeB or gNB), or some other terminology.

A BS 110 may provide communication coverage for a particular geographic area, sometimes referred to as a "cell," which may be stationary or may move according to the location of a mobile BS 110. In some examples, the BSs 110 may be interconnected to one another and/or to one or more other BSs or network nodes (not shown) in wireless communications network 100 through various types of backhaul interfaces (e.g., a direct physical connection, a wireless connection, a virtual network, or the like) using any suitable transport network. In the example shown in FIG. 1, the BSs 110*a*, 110*b*, and 110*c* may be macro BSs for the macro cells 102*a*, 102*b*, and 102*c*, respectively. The BS 110*x* may be a pico BS for a pico cell 102*x*. The BSs 110*y* and 110*z* may be femto BSs for the femto cells 102*y* and 102*z*, respectively. A BS may support one or multiple cells.

The BSs 110 communicate with one or more user equipments (UEs) 120*a-y* (each also individually referred to herein as "UE 120" or collectively as "UEs 120") in the wireless communications network 100. A UE may be fixed or mobile and may also be referred to as a user terminal (UT), a mobile station (MS), an access terminal, a station (STA), a client, a wireless device, a mobile device, or some other terminology. A user terminal may be a wireless device, such as a cellular phone, a smartphone, a personal digital assistant (PDA), a handheld device, a wearable device, a wireless modem, a laptop computer, a tablet, a personal computer, etc.

The BSs 110 are considered transmitting entities for the downlink and receiving entities for the uplink. The UEs 120 are considered transmitting entities for the uplink and receiving entities for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink. $N_{up}$ UEs may be selected for simultaneous transmission on the uplink, $N_{dn}$ UEs may be selected for simultaneous transmission on the downlink. $N_{up}$ may or may not be equal to $N_{dn}$, and $N_{up}$ and $N_{dn}$ may be static values or can change for each scheduling interval. Beam-steering or some other spatial processing technique may be used at the BSs 110 and/or UEs 120.

The UEs 120 (e.g., 120x, 120y, etc.) may be dispersed throughout the wireless communications network 100, and each UE 120 may be stationary or mobile. The wireless communications network 100 may also include relay stations (e.g., relay station 110r), also referred to as relays or the like, that receive a transmission of data and/or other information from an upstream station (e.g., a BS 110a or a UE 120r) and send a transmission of the data and/or other information to a downstream station (e.g., a UE 120 or a BS 110), or that relays transmissions between UEs 120, to facilitate communication between devices.

The BSs 110 may communicate with one or more UEs 120 at any given moment on the downlink and uplink. The downlink (i.e., forward link) is the communication link from the BSs 110 to the UEs 120, and the uplink (i.e., reverse link) is the communication link from the UEs 120 to the BSs 110. A UE 120 may also communicate peer-to-peer with another UE 120.

The wireless communications network 100 may use multiple transmit and multiple receive antennas for data transmission on the downlink and uplink. BSs 110 may be equipped with a number $N_{ap}$ of antennas to achieve transmit diversity for downlink transmissions and/or receive diversity for uplink transmissions. A set $N_u$ of UEs 120 may receive downlink transmissions and transmit uplink transmissions. Each UE 120 may transmit user-specific data to and/or receive user-specific data from the BSs 110. In general, each UE 120 may be equipped with one or multiple antennas. The Na UEs 120 can have the same or different numbers of antennas.

The wireless communications network 100 may be a time division duplex (TDD) system or a frequency division duplex (FDD) system. For a TDD system, the downlink and uplink share the same frequency band. For an FDD system, the downlink and uplink use different frequency bands. The wireless communications network 100 may also utilize a single carrier or multiple carriers for transmission. Each UE 120 may be equipped with a single antenna (e.g., to keep costs down) or multiple antennas (e.g., where the additional cost can be supported).

A network controller 130 (also sometimes referred to as a "system controller") may be in communication with a set of BSs 110 and provide coordination and control for these BSs 110 (e.g., via a backhaul). In certain cases (e.g., in a 5G NR system), the network controller 130 may include a centralized unit (CU) and/or a distributed unit (DU). In certain aspects, the network controller 130 may be in communication with a core network 132 (e.g., a 5G Core Network (5GC)), which provides various network functions such as Access and Mobility Management, Session Management, User Plane Function, Policy Control Function, Authentication Server Function, Unified Data Management, Application Function, Network Exposure Function, Network Repository Function, Network Slice Selection Function, etc.

In certain aspects of the present disclosure, the BSs 110 and/or the UEs 120 may include at least one phase-locked loop (PLL) circuit with a tuning voltage (Vtune) tracking circuit, as described in more detail herein.

Figure 2:
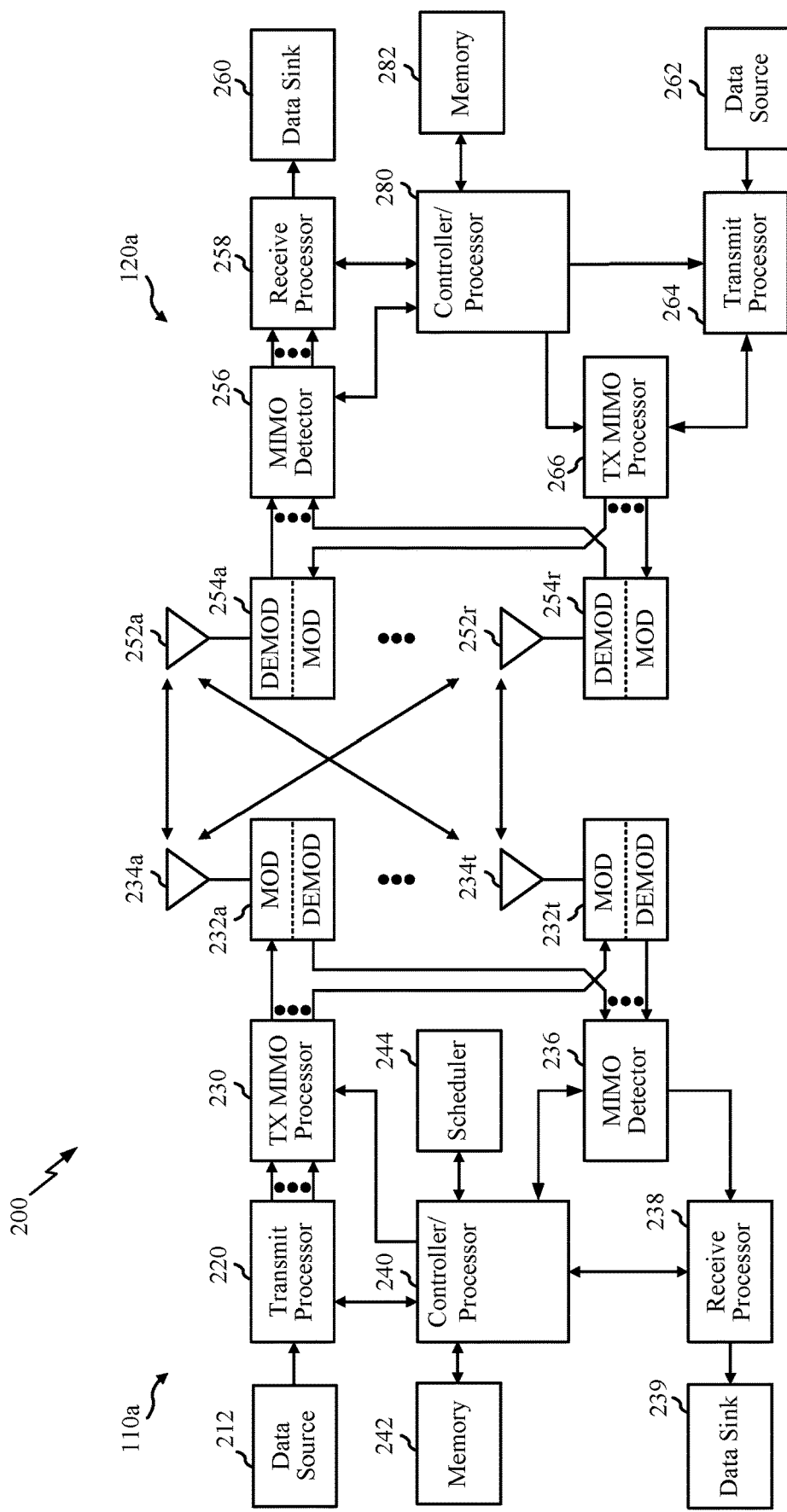
FIG. 2 is a block diagram conceptually illustrating a design of an example base station (BS) and user equipment (UE), in which aspects of the present disclosure may be practiced.

FIG. 2 illustrates example components of BS 110a and UE 120a (e.g., from the wireless communications network 100 of FIG. 1), in which aspects of the present disclosure may be implemented.

On the downlink, at the BS 110a, a transmit processor 220 may receive data from a data source 212, control information from a controller/processor 240, and/or possibly other data (e.g., from a scheduler 244). The various types of data may be sent on different transport channels. For example, the control information may be designated for the physical broadcast channel (PBCH), physical control format indicator channel (PCFICH), physical hybrid automatic repeat request (HARD) indicator channel (PHICH), physical downlink control channel (PDCCH), group common PDCCH (GC PDCCH), etc. The data may be designated for the physical downlink shared channel (PDSCH), etc. A medium access control (MAC)-control element (MAC-CE) is a MAC layer communication structure that may be used for control command exchange between wireless nodes. The MAC-CE may be carried in a shared channel such as a PDSCH, a physical uplink shared channel (PUSCH), or a physical sidelink shared channel (PSSCH).

The processor 220 may process (e.g., encode and symbol map) the data and control information to obtain data symbols and control symbols, respectively. The transmit processor 220 may also generate reference symbols, such as for the primary synchronization signal (PSS), secondary synchronization signal (SSS), PBCH demodulation reference signal (DMRS), and channel state information reference signal (CSI-RS).

A transmit (TX) multiple-input, multiple-output (MIMO) processor 230 may perform spatial processing (e.g., precoding) on the data symbols, the control symbols, and/or the reference symbols, if applicable, and may provide output symbol streams to the modulators (MODs) in transceivers 232a-232t. Each modulator in transceivers 232a-232t may process a respective output symbol stream (e.g., for orthogonal frequency division multiplexing (OFDM), etc.) to obtain an output sample stream. Each of the transceivers 232a-232t may further process (e.g., convert to analog, amplify, filter, and upconvert) the output sample stream to obtain a downlink signal. Downlink signals from the transceivers 232a-232t may be transmitted via the antennas 234a-234t, respectively.

At the UE 120a, the antennas 252a-252r may receive the downlink signals from the BS 110a and may provide received signals to the transceivers 254a-254r, respectively. The transceivers 254a-254r may condition (e.g., filter, amplify, downconvert, and digitize) a respective received signal to obtain input samples. Each demodulator (DEMOD) in the transceivers 232a-232t may further process the input samples (e.g., for OFDM, etc.) to obtain received symbols. A MIMO detector 256 may obtain received symbols from the demodulators in transceivers 254a-254r, perform MIMO detection on the received symbols if applicable, and provide detected symbols. A receive processor 258 may process (e.g., demodulate, deinterleave, and decode) the detected symbols, provide decoded data for the UE 120a to a data sink 260, and provide decoded control information to a controller/processor 280.

On the uplink, at UE 120a, a transmit processor 264 may receive and process data (e.g., for the physical uplink shared channel (PUSCH)) from a data source 262 and control information (e.g., for the physical uplink control channel (PUCCH)) from the controller/processor 280. The transmit processor 264 may also generate reference symbols for a reference signal (e.g., the sounding reference signal (SRS)). The symbols from the transmit processor 264 may be precoded by a TX MIMO processor 266 if applicable, further processed by the modulators (MODs) in transceivers 254a-254r (e.g., for single-carrier frequency division multiplexing (SC-FDM), etc.), and transmitted to the BS 110a. At the BS 110a, the uplink signals from the UE 120a may be received by the antennas 234, processed by the demodulators in transceivers 232a-232t, detected by a MIMO detector 236 if applicable, and further processed by a receive processor 238 to obtain decoded data and control information sent by the UE 120a. The receive processor 238 may provide the decoded data to a data sink 239 and the decoded control information to the controller/processor 240.

The memories 242 and 282 may store data and program codes for BS 110a and UE 120a, respectively. The memories 242 and 282 may also interface with the controllers/processors 240 and 280, respectively. A scheduler 244 may schedule UEs for data transmission on the downlink and/or uplink.

Antennas 252, processors 258, 264, 266, and/or controller/processor 280 of the UE 120a and/or antennas 234, processors 220, 230, 238, and/or controller/processor 240 of the BS 110a may be used to perform the various techniques and methods described herein.

In certain aspects of the present disclosure, the transceivers 232 and/or the transceivers 254 may include at least one phase-locked loop (PLL) circuit with a tuning voltage (Vtune) tracking circuit, as described in more detail herein.

Example RF Transceiver

Figure 3:
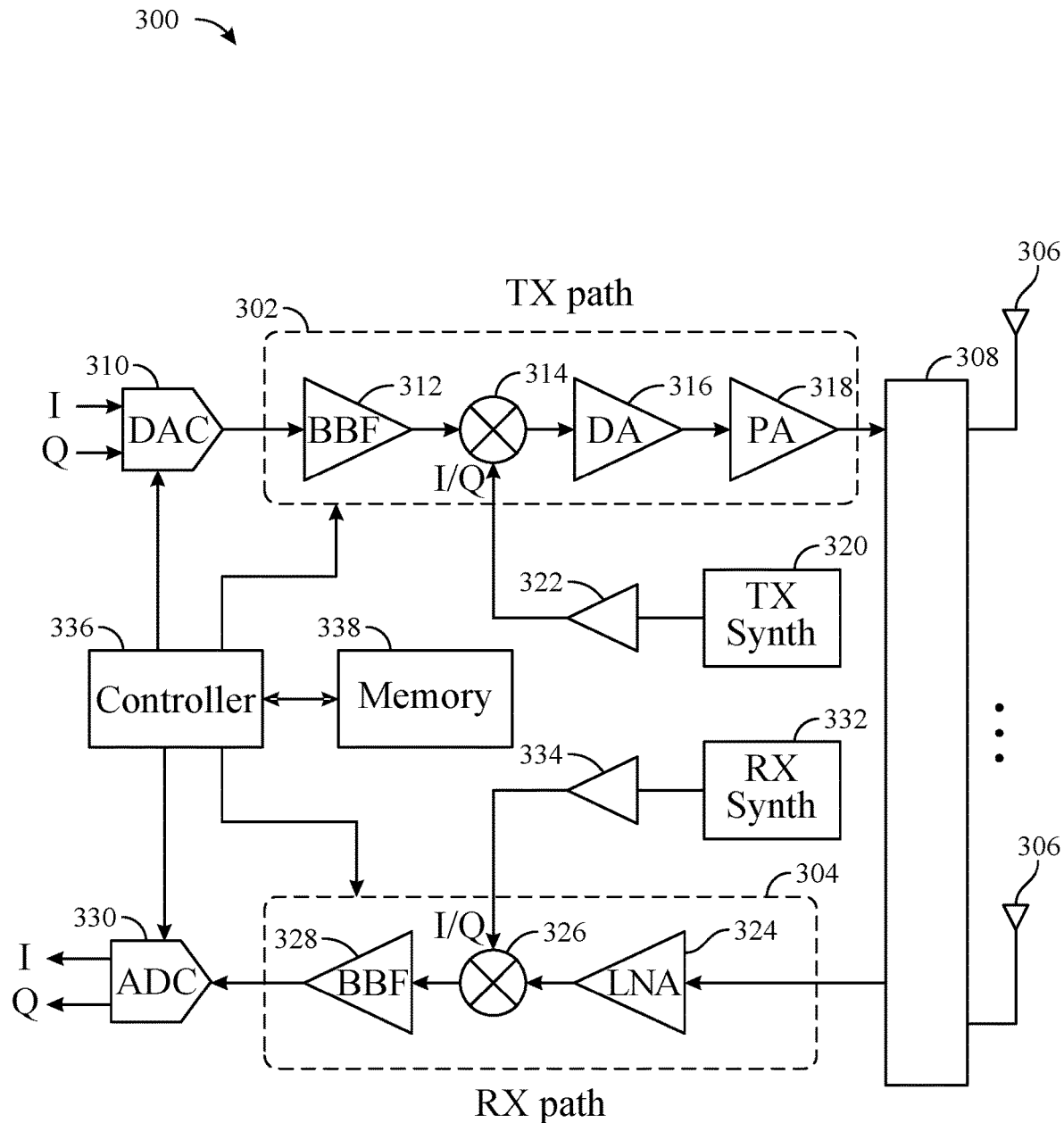
FIG. 3 is a block diagram of an example radio frequency (RF) transceiver, in which aspects of the present disclosure may be practiced.

FIG. 3 is a block diagram of an example radio frequency (RF) transceiver circuit 300, in accordance with certain aspects of the present disclosure. The RF transceiver circuit 300 includes at least one transmit (TX) path 302 (also known as a "transmit chain") for transmitting signals via one or more antennas 306 and at least one receive (RX) path 304 (also known as a "receive chain") for receiving signals via the antennas 306. When the TX path 302 and the RX path 304 share an antenna 306, the paths may be connected with the antenna via an interface 308, which may include any of various suitable RF devices, such as a switch, a duplexer, a diplexer, a multiplexer, and the like.

Receiving in-phase (I) and/or quadrature (Q) baseband analog signals from a digital-to-analog converter (DAC) 310, the TX path 302 may include a baseband filter (BBF) 312, a mixer 314, a driver amplifier (DA) 316, and a power amplifier (PA) 318. The BBF 312, the mixer 314, the DA 316, and the PA 318 may be included in a radio frequency integrated circuit (RFIC). For certain aspects, the PA 318 may be external to the RFIC.

The BBF 312 filters the baseband signals received from the DAC 310, and the mixer 314 mixes the filtered baseband signals with a transmit local oscillator (LO) signal to convert the baseband signal of interest to a different frequency (e.g., upconvert from baseband to a radio frequency). This frequency-conversion process produces the sum and difference frequencies between the LO frequency and the frequencies of the baseband signal of interest. The sum and difference frequencies are referred to as the "beat frequencies." The beat frequencies are typically in the RF range, such that the signals output by the mixer 314 are typically RF signals, which may be amplified by the DA 316 and/or by the PA 318 before transmission by the antenna(s) 306. While one mixer 314 is illustrated, several mixers may be used to upconvert the filtered baseband signals to one or more intermediate frequencies and to thereafter upconvert the intermediate frequency (IF) signals to a frequency for transmission.

The RX path 304 may include a low noise amplifier (LNA) 324, a mixer 326, and a baseband filter (BBF) 328. The LNA 324, the mixer 326, and the BBF 328 may be included in one or more RFICs, which may or may not be the same RFIC that includes the TX path components. RF signals received via the antenna(s) 306 may be amplified by the LNA 324, and the mixer 326 mixes the amplified RF signals with a receive local oscillator (LO) signal to convert the RF signal of interest to a different baseband frequency (e.g., downconvert). The baseband signals output by the mixer 326 may be filtered by the BBF 328 before being converted by an analog-to-digital converter (ADC) 330 to digital I and/or Q signals for digital signal processing.

Certain transceivers may employ frequency synthesizers with a variable-frequency oscillator (e.g., a voltage-controlled oscillator (VCO) or a digitally controlled oscillator (DCO)) to generate a stable, tunable LO with a particular tuning range. Thus, the transmit LO may be produced by a TX frequency synthesizer 320 with a transmit phase-locked loop (TxPLL). The transmit LO may be buffered or amplified by amplifier 322 before being mixed with the baseband signals in the mixer 314. Similarly, the receive LO may be produced by an RX frequency synthesizer 332 with a receive phase-locked loop (RxPLL). The receive LO may be buffered or amplified by amplifier 334 before being mixed with the RF signals in the mixer 326. For certain aspects, a single frequency synthesizer may be used for both the TX path 302 and the RX path 304. In certain aspects, the TX frequency synthesizer 320 and/or RX frequency synthesizer 332 may include a frequency multiplier, such as a frequency doubler, that is driven by an oscillator (e.g., a VCO) in the frequency synthesizer.

For certain aspects, the RxPLL and/or the TxPLL may be coupled to a tuning voltage (Vtune) tracking circuit, as described herein. For example, the RxPLL may be coupled to a first Vtune tracking circuit, and the TxPLL may be coupled to second Vtune tracking circuit.

A controller 336 (e.g., controller/processor 280 in FIG. 2) may direct the operation of the RF transceiver circuit 300A, such as transmitting signals via the TX path 302 and/or receiving signals via the RX path 304. The controller 336 may be a processor, a digital signal processor (DSP), an application-specific integrated circuit (ASIC), a field-programmable gate array (FPGA) or other programmable logic device (PLD), discrete gate or transistor logic, discrete hardware components, or any combination thereof. A memory 338 (e.g., memory 282 in FIG. 2) may store data and/or program codes for operating the RF transceiver circuit 300. The controller 336 and/or the memory 338 may include control logic (e.g., complementary metal-oxide-semiconductor (CMOS) logic).

While FIGS. 1-3 provide wireless communications as an example application in which certain aspects of the present disclosure may be implemented to facilitate understanding, certain aspects described herein may be used for PLLs in any of various other suitable systems (e.g., video monitors, microprocessors, high-speed serializer/deserializer (SerDes) systems, or other electronic systems).

Example Phase-Locked Loop

Figure 4:
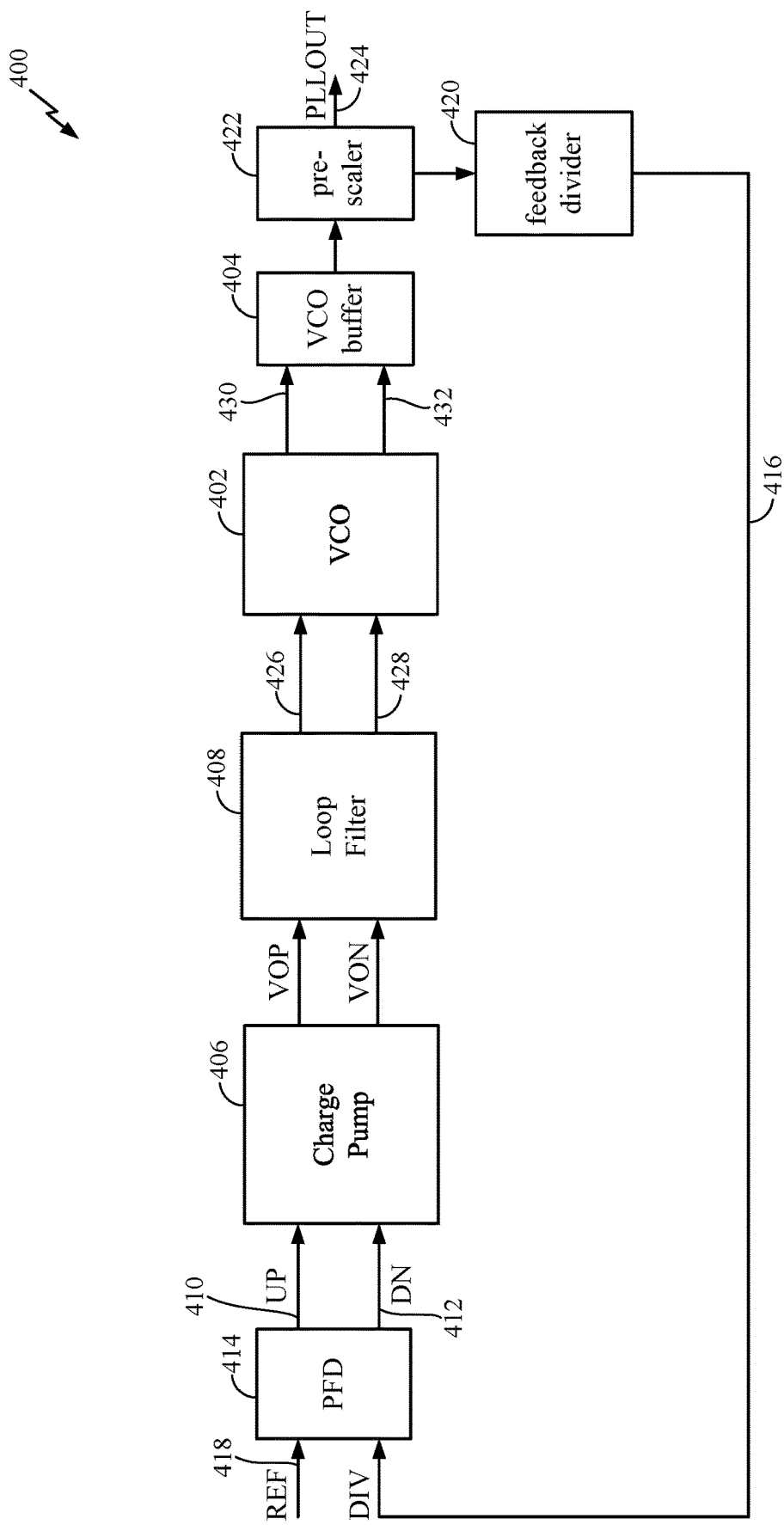
FIG. 4 is a block diagram of an example phase-locked loop (PLL), in which aspects of the present disclosure may be practiced.

FIG. 4 is a block diagram of an example phase-locked loop (PLL) 400, in which aspects of the present disclosure may be practiced. The PLL 400 may be utilized in a frequency synthesizer, such as a transmit phase-locked loop (TxPLL) in the TX frequency synthesizer 320 or a receive phase-locked loop (RxPLL) in the RX frequency synthesizer 332 of FIG. 3.

As illustrated in FIG. 4, a charge pump 406 coupled to a low-pass loop filter 408 (also referred to as a "charge pump filter" or "PLL loop filter") may provide a control voltage (also referred to as a "tuning voltage" or "Vtune") to a voltage-controlled oscillator (VCO) 402, where the control voltage is used to adjust an oscillation frequency of the VCO 402. The charge pump 406 and the VCO 402 may receive power via two power supply rails: a positive supply rail and a negative supply rail. Switches in the charge pump 406 may be controlled by up/down pulse signals 410, 412 (labeled "UP" and "DN"), and the loop filter 408 may reject the high frequency transient signals from this switching activity. These up/down pulse signals 410, 412 may be generated by a phase-frequency detector (PFD) 414, which may compare a feedback signal 416 (based on an output or processed output of the VCO 402 and labeled "DIV") to a reference frequency signal 418 (labeled "REF"). In an aspect, as illustrated in FIG. 4, the feedback signal 416 may be generated by buffering the output of the VCO 402 with a VCO buffer 404, scaling the buffered signal in a pre-scaler 422 to generate the PLL's output signal 424 (labeled "PLL-OUT"), and dividing an output of the pre-scaler 422 in a feedback divider 420.

In some aspects of the present disclosure, as illustrated in FIG. 4, the input control voltage for the VCO 402 may be provided by the charge pump 406 and the low-pass loop filter 408 via VCO control inputs 426, 428. A resonant tank circuit of the VCO 402 may generate, at differential VCO outputs 430, 432, a periodic signal having a specific frequency (e.g., determined by a voltage at the VCO control inputs 426, 428), which may be input to the VCO buffer 404. The VCO buffer 404 may be coupled to the differential VCO outputs 430, 432 in an effort to isolate the VCO 402 from the load in the PLL 400 and other circuits receiving the PLL's output signal 424. The VCO buffer 404 may be also employed in an effort to amplify the signal swing and correct any duty cycle distortions of the differential VCO outputs 430, 432.

Although the PLL 400 is implemented as a differential circuit in FIG. 4, it is to be understood that the PLL may also alternatively be implemented as a single-ended circuit.

Example Vtune Tracker

To conserve power, a phase-locked loop (PLL) (e.g., PLL 400) may be switched between mission mode, where the PLL is in operation, and standby mode, where the PLL is inactive. For example, a receive phase-locked loop (RxPLL) may enter mission mode while a receive chain (e.g., RX path 304) is receiving or scheduled to receive signals (e.g., on a downlink for a user equipment (UE) or an uplink for a base station), and may enter standby mode otherwise. Conversely, a transmit phase-locked loop (TxPLL) may enter mission mode while a transmit chain (e.g., TX path 302) is transmitting or scheduled to transmit signals (e.g., on an uplink for a UE or a downlink for a base station), and may enter standby mode otherwise.

Figure 5:
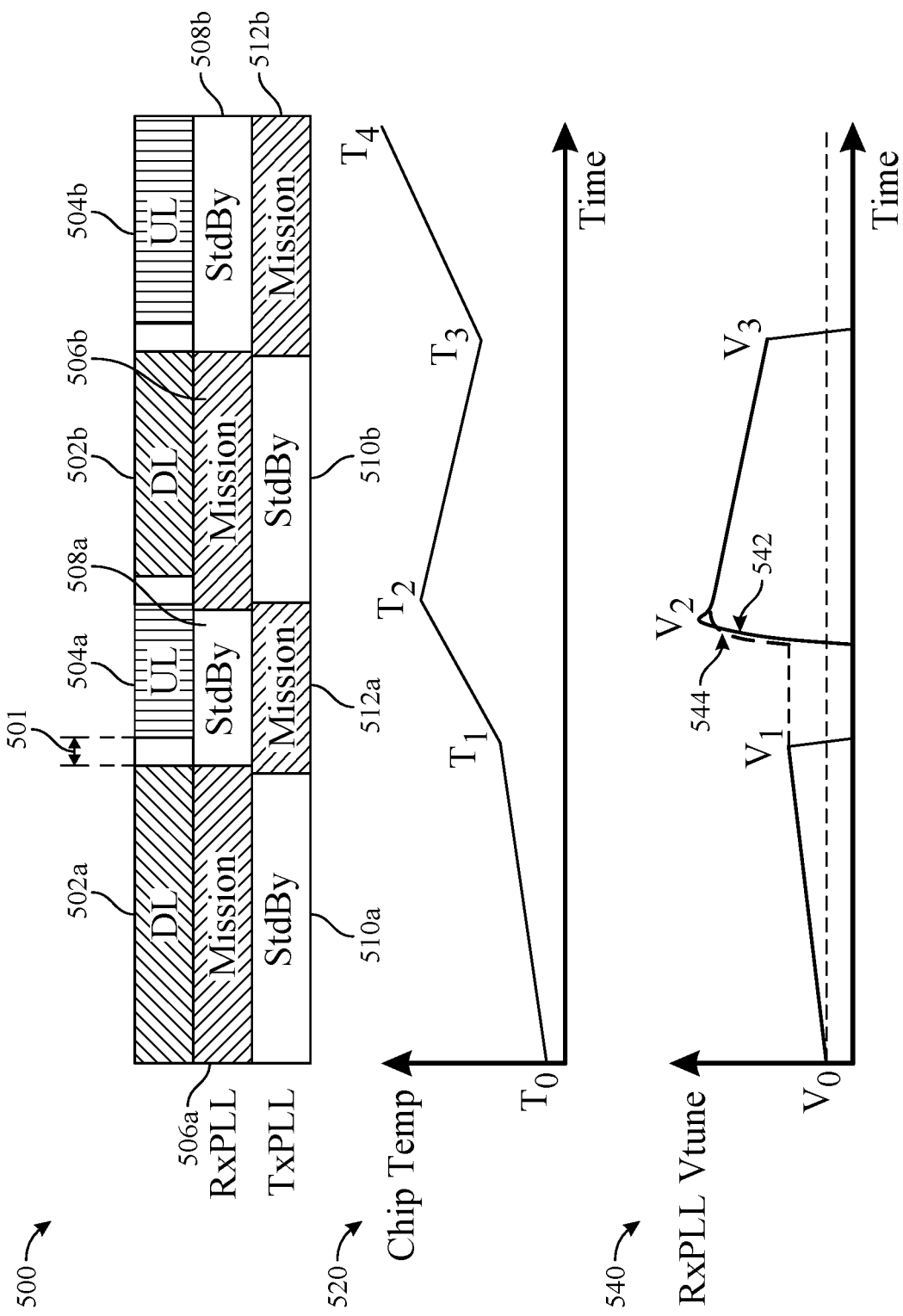
FIG. 5 includes an example receive and transmit timing diagram, a corresponding chip temperature plot with time, and a corresponding example receive phase-locked loop (RxPLL) tuning voltage plot with time.

FIG. 5 includes an example receive and transmit timing diagram 500, which illustrates switching receive and transmit PLLs of a UE between mission mode and standby mode. FIG. 5 also includes an example chip temperature plot 520 with time and an example RxPLL tuning voltage (Vtune) plot 540 with time, both of which correspond to the timing diagram 500. The chip may be an integrated circuit (IC) with the RxPLL and the TxPLL. The chip temperature plot 520 depicts how chip temperature changes as the PLLs of the UE switch between mission mode and standby mode with respect to time, and the RxPLL Vtune plot 540 shows how Vtune of an example RxPLL changes with respect to time.

Referring to the timing diagram 500, as the UE switches between downlink (DL) receptions and uplink (UL) transmissions, each PLL may be switched to either mission mode or standby mode. In each respective PLL's mission mode, that PLL is operating, whereas in each respective PLL's standby mode, that PLL 400 is not operating (e.g., power may be removed from certain PLL sub-blocks and/or the PLL may be operated in very low power mode). For example, when the UE is in a DL slot and is receiving (or scheduled to receive) a signal, the RxPLL is generally in mission mode, and the TxPLL is typically in standby mode. On the other hand, when the UE is in a UL slot and is transmitting (or scheduled to transmit) a signal, the RxPLL is generally in standby mode, and the TxPLL is generally in mission mode. The opposite may apply to PLLs of a base station.

As illustrated in the timing diagram 500, as an example, in a first DL slot 502a, an RxPLL may be in a first receive mission mode 506a, and the TxPLL may be in a first transmit standby mode 510a, at least most of the time. In a first UL slot 504a, the RxPLL may be in a first receive standby mode 508a, and the TxPLL may be in a first transmit mission mode 512a, for the majority of the time. In a second DL slot 502b, the RxPLL may be in a second receive mission mode 506b, and the TxPLL may be in a second transmit standby mode 510b, at least most of the time. In a second UL slot 504b, the RxPLL may be in a second receive standby mode 508b, and the TxPLL may be in a second transmit mission mode 512b. This may continue for each subsequent UL and DL slot. As illustrated, there may be a gap 501 (e.g., a delay of 7 μs) between each pair of DL and UL slots, which may allow time for activating and inactivating each of the PLLs.

The corresponding chip temperature plot 520 illustrates how the temperature of the corresponding chip (labeled "Chip Temp") changes with respect to time as the PLLs switch between modes. As the PLLs operate and switch between transmitting and receiving the temperature of the chip may also change. For example, transmissions in a UL slot may cause a greater temperature increase than receptions in a DL slot.

For example, in the first DL slot 502a while the RxPLL and receive chain are operating, the temperature of the chip increases from a first temperature $T_0$ (e.g., a starting temperature) to a second temperature $T_1$ (e.g., as the chip is warming up). Next, when the UE is in the first UL slot 504a and transmitting a signal, the chip temperature may increase from the second temperature $T_1$ to a third temperature $T_2$. Because transmitting a signal involves more energy than receiving a signal in this example, the temperature of the chip increases at a faster rate in the first UL slot 504a than in the first DL slot 502a. In other cases, receiving a signal may involve more energy than transmitting a signal Subsequently, in the second DL slot 502b the chip temperature may decrease from the third temperature $T_2$ to a fourth temperature $T_3$. Here, because receiving a signal involves less energy than transmitting, the chip temperature may decrease from the third temperature $T_2$ to the fourth temperature $T_3$, as shown in plot 520. In other examples, the chip temperature may alternatively increase between temperatures $T_2$ and $T_3$ at a slower rate than the temperature change between temperatures $T_1$ and $T_2$.

Then, in the second UL slot 504b, because of higher energy during transmission, the chip temperature may increase from the fourth temperature $T_3$ to a fifth temperature $T_4$.

As the temperature of the chip changes while a PLL is in mission mode, the components of the PLL may change with temperature, and thus, the PLL may change the tuning voltage (Vtune) to maintain the frequency of the oscillating signal output by the VCO (e.g., VCO 402) and phase lock. Hence, Vtune drifts proportionally to the change in chip temperature. However, once the PLL is switched into standby mode, Vtune is lost (e.g., is not maintained in the feedback loop) while the PLL is not operating. Then, when the PLL reenters mission mode, Vtune may be reset and start from the same initial starting point (e.g., 0 V or half the power supply rail voltage (e.g., Vdd of the charge pump, as shown in FIG. 6B)). Referring back to the timing diagram 500, it may be desirable for Vtune to settle within the predefined time for the gap 501 between each of the DL and UL slots, such that the PLL has little to no frequency error when the slot begins.

Referring to the corresponding plot 540, as the chip temperature changes from the first temperature $T_0$ to the second temperature $T_1$ when the RxPLL is in the first receive mission mode 506a, Vtune is changed from initial voltage $V_0$ to voltage $V_1$ to maintain the frequency of the oscillating signal from the VCO, caused by the change in temperature. In some cases, the initial voltage $V_0$ may be a predefined starting voltage for the RxPLL, such as Vdd/2.

When the RxPLL is switched to the first receive standby mode 508a, Vtune is lost and may drop (e.g., to 0 V, as illustrated in the plot 540). When the RxPLL is in the first receive standby mode 508a, the temperature of the chip changes from the second temperature $T_1$ to the third temperature $T_2$ while Vtune is not updated, allowing for a large VCO frequency drift with temperature. When the RxPLL is switched to the second receive mission mode 506b and reactivated, the RxPLL may resume with a predefined starting voltage (e.g., 0 V or Vdd/2). Due to the temperature change during the first receive standby mode 508a where Vtune was not updating, there may a substantial Vtune offset between the predefined starting voltage (e.g., voltage $V_0$) and the eventual new Vtune to maintain lock at the new temperature (temperature $T_2$). The high Vtune offset causes a large initial PLL frequency error. Therefore, it may take a longer time for Vtune to settle as Vtune rises from the predefined starting voltage to a new Vtune at voltage $V_2$ that corresponds to the third temperature $T_2$. In other words, the large initial PLL frequency error is responsible for slow PLL and Vtune settling, as shown by waveform 542 in plot 540.

Once Vtune settles at voltage $V_2$, Vtune is updated during the second mission mode by the RxPLL and reaches voltage $V_3$ (as the temperature drops to temperature $T_3$) before entering the second receive standby mode 508b, where Vtune is once again lost (and reset).

Certain aspects of the present disclosure provide a Vtune tracking circuit that saves Vtune from a PLL's mission mode before entering a PLL's standby mode and restores Vtune before reentering the PLL's mission mode, thereby significantly reducing the Vtune offset, initial PLL frequency error, and PLL/Vtune settling time upon reentry, especially with changes in temperature. In other words, the Vtune tracking circuit helps the PLL to lock quickly over temperature when a PLL is reactivated.

For example, in the plot 540, such a Vtune tracking circuit may store voltage $V_1$ before the RxPLL enters the first receive standby mode 508a. When the RxPLL enters the second receive mission mode 506b, the stored Vtune (voltage $V_1$) is restored, and because the restored voltage $V_1$ is closer to the new Vtune voltage (voltage $V_2$) associated with temperature $T_2$ than the predefined starting voltage (e.g., voltage $V_0$), the Vtune settling time is reduced, as illustrated by waveform 544.

Figure 6A:
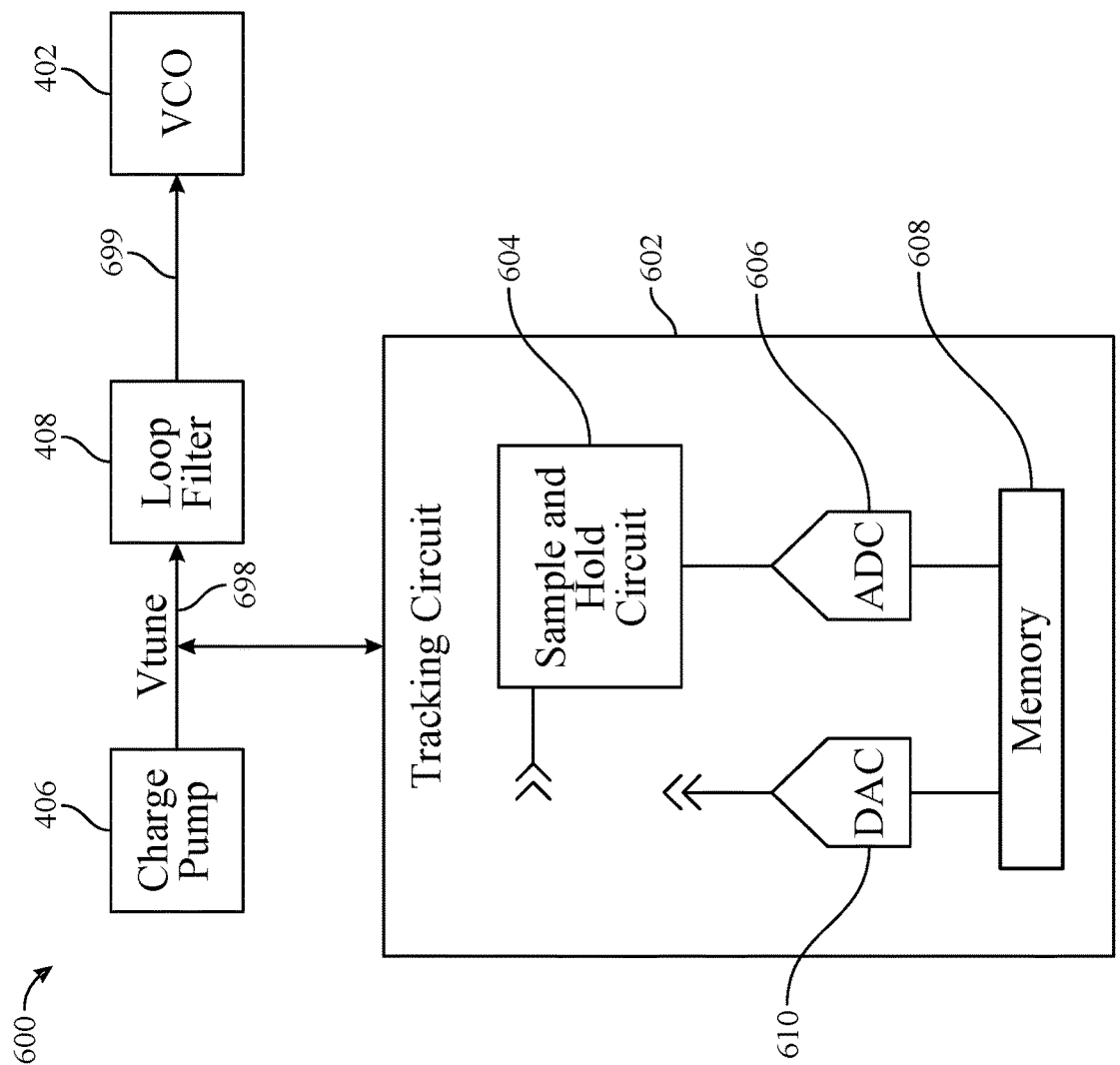
FIG. 6A illustrates an example portion of a PLL circuit with tracking circuitry, in accordance with certain aspects of the present disclosure.
Figure 6B:
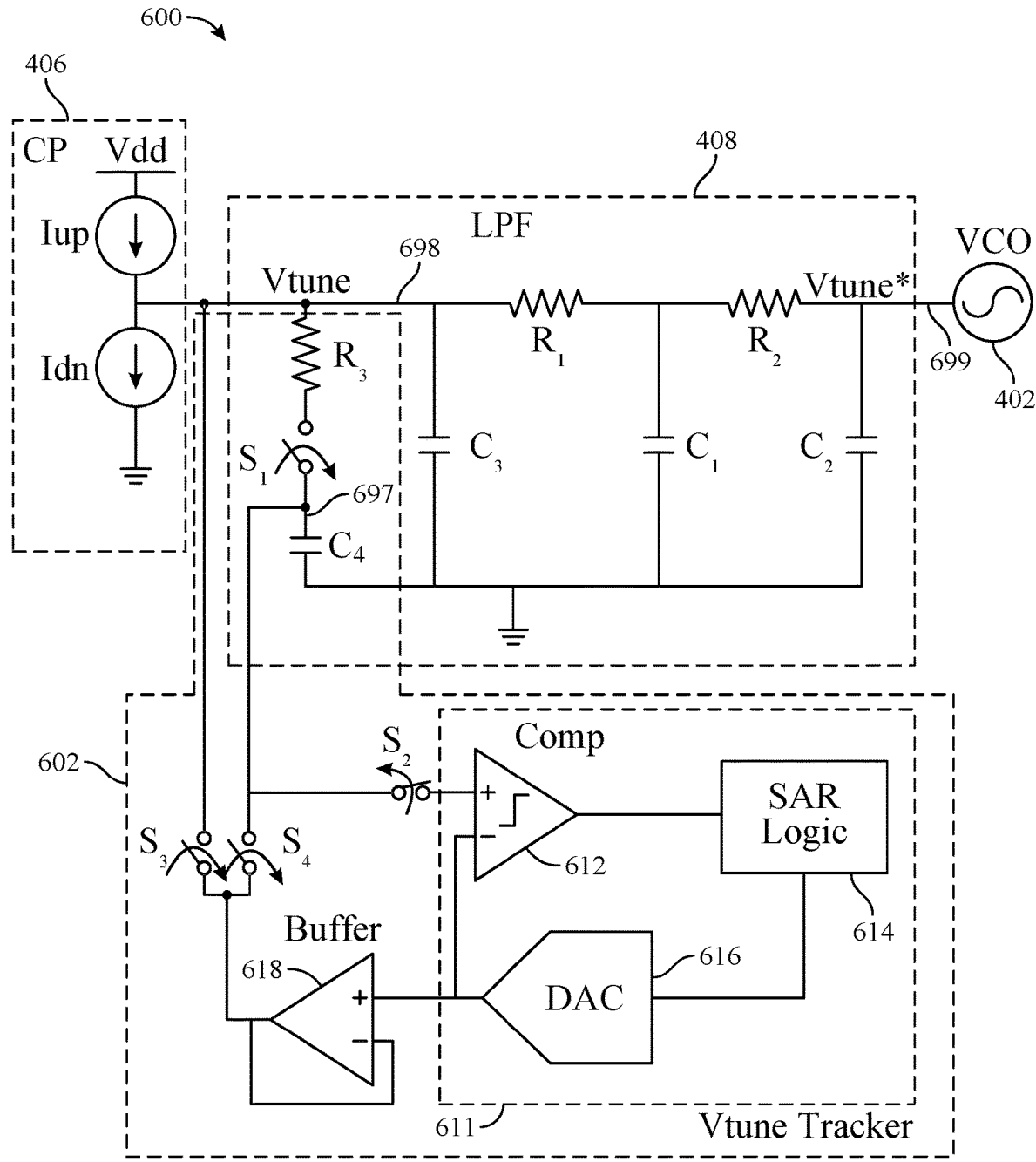
FIG. 6B illustrates example circuits for implementing the PLL circuit of FIG. 6A, in accordance with certain aspects of the present disclosure.

FIG. 6A illustrates a portion of an example PLL circuit 600 with a tracking circuit 602, in accordance with certain aspects of the present disclosure. The PLL circuit 600 may be similar to the PLL 400, but with the addition of the tracking circuit 602. For certain aspects, the RxPLL may have a tracking circuit coupled thereto, and the TxPLL may have another tracking circuit coupled thereto.

As shown, the tracking circuit 602 may be coupled to the output of the charge pump 406 at node 698, but may alternatively be coupled to the output of the loop filter 408 at node 699 for other aspects. The tracking circuit 602 may comprise a sample-and-hold circuit 604, an analog-to-digital converter (ADC) 606, memory 608, and a digital-to-analog converter (DAC) 610. The sample-and-hold circuit 604 may have an input coupled to the output of the charge pump 406 and may have an output coupled to an input of the ADC 606. An output of the ADC 606 and an input of the DAC 610 may be coupled to memory 608. The memory 608 may comprise a register, for example, or any other suitable storage component, capable of storing a digital code for representing Vtune at a desired resolution. An output of the DAC 610 may be coupled to the node 698 (or the node 699), which may be through a buffer and/or other suitable components.

The sample-and-hold circuit 604 may be configured to sample and hold an analog voltage value of Vtune (e.g., unfiltered at the output of the charge pump 406) while the PLL circuit 600 is in mission mode or just before the PLL exits mission mode. The ADC 606 may be configured to convert the sampled and held analog value of Vtune to a digital representation of Vtune and write this representation to the memory 608. The memory 608 may be configured to store the digital representation of Vtune for subsequent restoration. Just before or as the PLL reenters the mission mode, the DAC 610 may be configured to read the stored digital representation of Vtune from the memory 608 and convert this to an analog version of the stored representation for using as a starting value of Vtune when the PLL is reactivated. In other words, the DAC 610 (and other associated circuitry) may be configured to restore the sampled and held value of Vtune once the PLL circuit 600 reenters mission mode, for faster settling of the PLL compared to starting from some predefined starting voltage.

For certain aspects, the tracking circuit may be powered off most of the time to conserve power. In this case, the tracking circuit may be powered on just before the PLL associated therewith exits mission mode and enters standby mode to capture Vtune and store Vtune or a representation of Vtune (e.g., a digital code). For certain aspects, the tracking circuit may remain on during standby mode, whereas in other aspects, the tracking circuit may be powered off after storing (the representation of) Vtune. In the latter case, the tracking circuit may be powered on just before or as the PLL reenters mission mode and restore Vtune in the PLL. For other aspects (e.g., where power consumption by the tracking circuit is not a concern), the tracking circuit may be left powered on most or all of the time.

FIG. 6B illustrates example circuits for implementing various aspects of the PLL circuit 600 of FIG. 6A, in accordance with certain aspects of the present disclosure. As described above, the PLL circuit 600 may comprise a charge pump (CP) 406, a tracking circuit 602, a loop filter 408, and a voltage-controlled oscillator (VCO) 402.

As illustrated, the loop filter 408 may be implemented as a fourth-order low-pass filter (LPF) with series resistive elements $R_1$ and $R_2$, shunt capacitive elements $C_1$ and $C_2$, shunt capacitive elements $C_3$ and $C_4$, and resistive element $R_3$. However, it is to be understood that the loop filter 408 may be designed as any suitable filter, and with any suitable number of poles and zeroes. The charge pump 406 may include a current source $I_{UP}$ and a current sink $I_{DN}$ used to charge and discharge, respectively. Shunt capacitive element $C_3$ may be coupled between the output of the charge pump 406 and a reference potential node (e.g., electrical ground) for the PLL circuit 600. As illustrated and explained above, the charge pump 406 produces a tuning voltage (Vtune). Vtune is low-pass filtered by the loop filter 408 to remove transients and other higher frequency components (e.g., from the switching action of the charge pump 406) to generate a filtered tuning voltage (Vtune*) at node 699. Vtune* may more closely resemble a DC voltage. Vtune* may be used to adjust the frequency of an oscillating signal generated by the VCO 402.

As implemented in the example of FIG. 6B, the sample-and-hold circuit 604 in the Vtune tracking circuit 602 may include a switch $S_1$, which may be coupled between resistive element $R_3$ and capacitive element $C_4$. Thus, resistive element $R_3$ and capacitive element $C_4$ may also be considered as part of the sample-and-hold circuit 604. With switch $S_1$ closed during mission mode, resistive element $R_3$ and capacitive element $C_4$ may operate in a similar manner to a low-pass filter and filter out transients and other high frequency components of Vtune from the switching action of the charge pump during mission mode. The sample-and-hold circuit 604 is configured to sample Vtune (e.g., while the PLL circuit 600 is in mission mode or just before exiting mission mode) and hold the sampled Vtune (e.g., for quantization and storage). Thus, switch $S_1$ may be open during quantization of Vtune (referred to as "sampling mode," "quantization mode," or "converting mode"), such that capacitive element $C_4$ may not be discharged to Vtune or charge pump 406, and switch $S_1$ may be closed during mission mode and when the PLL circuit 600 exits standby mode and restores Vtune (referred to as "restoring mode").

The sample-and-hold circuit 604 may also include switch $S_2$, which is coupled between a node 697 (which is between switch $S_1$ and capacitive element $C_4$) and an input of the ADC. Switch $S_2$ may be closed during sampling of Vtune (while switch $S_1$ is open) and may be open after the sampled Vtune is quantized (e.g., during standby mode, restoring mode, and mission mode).

The ADC 606 may be implemented by a successive-approximation register (SAR) analog-to-digital converter (ADC) 611, as illustrated. The SAR ADC 611 may include a comparator 612, SAR logic 614, and a digital-to-analog converter (DAC) 616. The comparator 612 may have a first input (e.g., the positive input) coupled to switch $S_2$ and may have a second input (e.g., the negative input) coupled to the output of the DAC 616. The SAR logic 614 may comprise a register, for example, may have an input coupled to the output of the comparator 612, and may have an output coupled to the input of the DAC 616. With this loop, the SAR ADC 611 may use a binary search through different quantization levels (e.g., different DAC steps) before converging upon the final digital signal for outputting from the SAR ADC.

More specifically, the comparator 612 may be configured to compare the held Vtune to the analog output voltage of the DAC 616 and output an indication of the result of the comparison. For example, the comparator, 612 may be configured to output a logic "0" if the output voltage of the DAC 616 is greater than the held Vtune and to output a logic "1" if the output voltage of the DAC 616 is less than the held Vtune. The SAR logic 614 may be configured to successively update, store, and output, based on the output of the comparator 612, a digital voltage signal to the DAC 616. The DAC 616 may be configured to convert each successive digital voltage signal to an analog voltage signal applied to the second input of the comparator 612. After the SAR ADC 611 has quantized the held Vtune voltage, switch $S_2$ may be opened, and the SAR logic 614 may store the digital code word representing the sampled and held Vtune. Therefore, the SAR logic 614 in FIG. 6B may function as part of the ADC 606 and the memory 608 in FIG. 6A. Furthermore, the DAC 616 in FIG. 6B may function as part of the ADC 606 and as the DAC 610 in FIG. 6A.

As illustrated in the example implementation of FIG. 6B, the tracking circuit 602 may also include a buffer 618, a switch $S_3$, and a switch $S_4$. The buffer may have a first input (e.g., a positive input) coupled to the output of the DAC 616 and a second input (e.g., a negative input) coupled to an output of the buffer 618 in a feedback loop. Switch $S_3$ may be coupled between node 698 and the output of the buffer 618. Switch $S_4$ may be coupled between node 697 and the output of the buffer 618. The buffer 618 and switches $S_3$ and $S_4$ may be used to restore the stored Vtune, as described below.

In operation, each of the switches is operated based on the mode of operation of the PLL circuit 600. For example, when the PLL circuit 600 is in mission mode, switches $S_2$, $S_3$, and $S_4$ are open while switch $S_1$ is closed. While switch $S_1$ is closed, Vtune is sampled by charging capacitive element $C_4$ while the PLL circuit 600 is operating. Just before or at the instant the PLL circuit 600 exits mission mode, switch $S_1$ may be opened, and switch $S_2$ may be closed, while switches $S_3$ and $S_4$ remain open, in the sampling mode. Closing switch $S_2$ couples Vtune to the SAR ADC 611 for quantization. Switches $S_1$, $S_3$, and $S_4$ being open disconnects the SAR ADC 611 from the output of the charge pump 406 and the buffer 618.

After switch $S_2$ is closed, the held Vtune is quantized by the SAR ADC 611. At the end of the conversion, the digital representation of the held Vtune is stored by the SAR logic 614. Depending on the resolution of the SAR ADC 611, the digital representation may be substantially equivalent to the held Vtune. Even though capacitive element $C_4$ may be discharging during the conversion, the SAR ADC 611 may operate fast enough so that the held Vtune is quantized before $C_4$ discharges a significant amount.

Also after conversion, switch $S_2$ may be opened, to exit the sampling mode and enter the standby mode. While switches $S_1$, $S_2$, and $S_4$ are opened, capacitive element $C_4$ may be slowly discharged via leakage during standby mode.

Before the PLL circuit 600 reenters mission mode, the PLL circuit enters the restoring mode to restore the previous level of Vtune. In the restoring mode, switches $S_1$, $S_3$, and $S_4$ are closed, and switch $S_2$ may remain open. The stored representation of Vtune is output by the SAR logic 614, converted by the DAC 616 to an analog voltage, buffered by the buffer 618, and output to the nodes 697 and 698 to begin controlling the VCO 402. Advantageously, Vtune is restored to the previous level of Vtune at the end of the prior mission mode and does not reset to some predefined starting voltage (e.g., Vdd/2). After Vtune is restored, switches $S_3$ and $S_4$ are opened, and the SAR ADC 611 and buffer 618 may be turned off to conserve power, for certain aspects. Then, the PLL circuit 600 may reenter the mission mode (in which switches $S_2$, $S_3$, and $S_4$ are open and switch $S_1$ is closed).

The process described above may be repeated as the PLL circuit 600 switches between operating modes.

Example Operations for Wireless Communication

Figure 7:
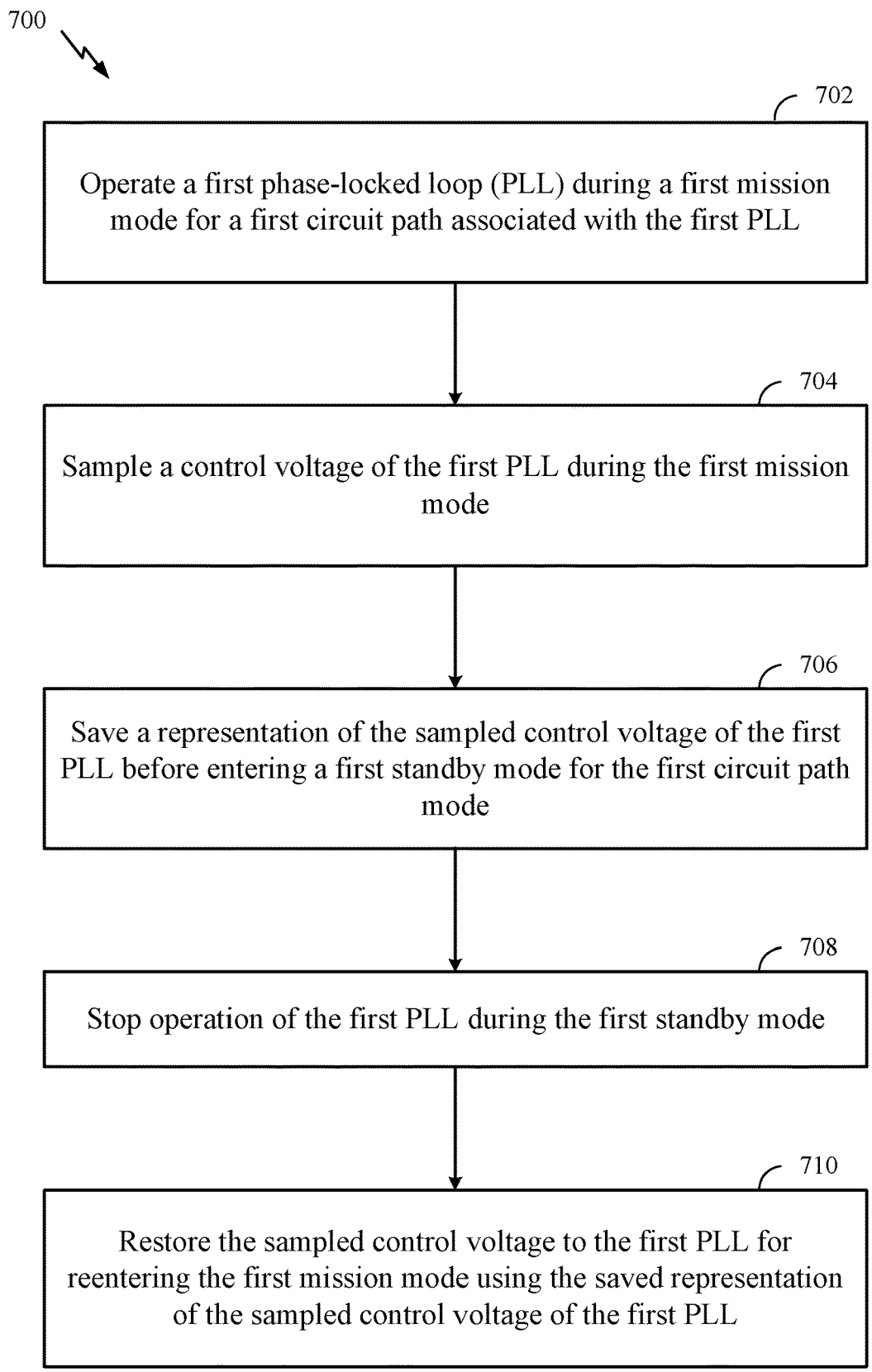
FIG. 7 is a flow diagram of example operations for wireless communication, in accordance with certain aspects of the present disclosure.

FIG. 7 is a flow diagram of example operations 700 for wireless communication, in accordance with certain aspects of the present disclosure. The operations 700 may be performed, for example, by a radio frequency (RF) transceiver (e.g., the RF transceiver circuit 300 of FIG. 3) with a receive phase-locked loop (RxPLL) (e.g., in the RX frequency synthesizer 332) and/or a transmit phase-locked loop (Tx-PLL) (e.g., in the TX frequency synthesizer 320), where at least one of the PLLs is coupled to tuning voltage (Vtune) tracking circuitry (e.g., the tracking circuit 602 of FIG. 6A or 6B) as described above. The operations 700 may be controlled by a controller (e.g., the controller 336 of FIG. 3) coupled to the PLL(s) and the tracking circuitry.

The operations 700 may generally involve, at block 702, operating a first phase-locked loop (PLL) (e.g., an RxPLL or a TxPLL, such as PLL circuit 600) during a first mission mode (e.g., mission mode 506a or 512a) for a first circuit path (e.g., the RX path 304 or the TX path 302) associated with the first PLL. At block 704, the tracking circuitry may sample a control voltage (e.g., Vtune) of the first PLL during the first mission mode and, at block 706, save a representation (e.g., a digital code) of the sampled control voltage of the first PLL before entering a first standby mode (e.g., standby mode 508a or 510b) for the first circuit path. Operation of the first PLL (or at least a portion of the first PLL) is stopped for the first standby mode at block 708. At block 710, the tracking circuitry may restore the sampled control voltage to the first PLL for reentering the first mission mode using the saved representation of the sampled control voltage of the first PLL.

According to certain aspects, the first circuit path is a receive path (e.g., RX path 304). In this case, the first PLL may include a receive phase-locked loop (RxPLL), and the first mission mode may be for reception of a downlink (DL) signal. For other aspects, the first circuit path is a transmit path (e.g., TX path 302). In this case, the first PLL includes a transmit phase-locked loop (TxPLL), and the first mission mode may be for transmission of an uplink (UL) signal.

According to certain aspects, the operations 700 further involve converting the sampled control voltage of the first PLL with a successive-approximation register (SAR) analog-to-digital converter (ADC) (e.g., SAR ADC 611) to generate the representation of the sampled control voltage (e.g., before the saving at block 706). The SAR ADC may include SAR logic (e.g., SAR logic 614). For certain aspects, saving the representation at block 706 includes saving a digital representation of the sampled control voltage of the first PLL in the SAR logic. The SAR ADC may further include a digital-to-analog converter (DAC) (e.g., DAC 616). For certain aspects, restoring the sampled control voltage to the first PLL at block 710 involves converting, with the DAC, the digital representation of the sampled control voltage of the first PLL to an analog signal. Restoring the sampled control voltage to the first PLL may further include buffering the analog signal (e.g., with buffer 618) and using the buffered analog signal as the control voltage for restarting the first PLL to reenter the first mission mode.

According to certain aspects, the operations 700 further involve operating a second PLL (e.g., a TxPLL or an RxPLL, such as PLL circuit 600) during a second mission mode (e.g., mission mode 506b or 512b) for a second circuit path (e.g., TX path 302 or RX path 304) associated with the second PLL; sampling a control voltage (Vtune) of the second PLL during the second mission mode; saving a representation (e.g., a digital code) of the sampled control voltage of the second PLL for entering a second standby mode (e.g., standby mode 508b) for the second circuit path; stopping operation of the second PLL for the second standby mode; and restoring the sampled control voltage to the second PLL for reentering the second mission mode using the saved representation of the sampled control voltage of the second PLL. For certain aspects, the first circuit path is a receive path (e.g., RX path 304), the first PLL includes an RxPLL, and the first mission mode is for reception of a DL signal. For certain aspects, the second circuit path is a transmit path (e.g., TX path 302), the second PLL includes a TxPLL, and the second mission mode is for transmission of a UL signal.

For certain aspects, the first mission mode may overlap the second standby mode in time. Alternatively or additionally, the second mission mode may overlap the first standby mode in time.

Example Aspects

In addition to the various aspects described above, specific combinations of aspects are within the scope of the present disclosure, some of which are detailed below:

Aspect 1: A phase-locked loop (PLL) circuit comprising: a charge pump; a voltage-controlled oscillator (VCO) having a control input coupled to an output of the charge pump via a node; and a tracking circuit coupled to the node and configured to sample a voltage of the node during a mission mode, save a representation of the sampled voltage before entering a standby mode, and restore the sampled voltage to the node for reentering the mission mode using the saved representation of the sampled voltage.

Aspect 2: The PLL circuit of Aspect 1, wherein the PLL circuit comprises a receive phase-locked loop (RxPLL) and wherein the mission mode is for reception of a downlink (DL) signal.

Aspect 3: The PLL circuit of Aspect 1, wherein the PLL circuit comprises a transmit phase-locked loop (Tx-PLL) and wherein the mission mode is for transmission of an uplink (UL) signal.

Aspect 4: The PLL circuit of any of Aspects 1 to 3, wherein the tracking circuit comprises a sample-and-hold circuit.

Aspect 5: The PLL circuit of Aspect 4, wherein the sample-and-hold circuit comprises a resistive element, a first switch, and a capacitive element coupled in series between the node and a reference potential node for the PLL circuit.

Aspect 6: The PLL circuit of Aspect 5, wherein the sample-and-hold circuit further comprises a second switch coupled to a node between the first switch and the capacitive element.

Aspect 7: The PLL circuit of any of Aspects 4 to 6, wherein the tracking circuit further comprises a successive-approximation register (SAR) analog-to-digital converter (ADC) having an input coupled to an output of the sample-and-hold circuit.

Aspect 8: The PLL circuit of Aspect 7, wherein the SAR ADC comprises: a comparator having a first input coupled to the output of the sample-and-hold circuit; SAR logic having an input coupled to an output of the comparator; and a digital-to-analog converter (DAC)

having an input coupled to an output of the SAR logic and having an output coupled to a second input of the comparator.

Aspect 9: The PLL circuit of Aspect 8, wherein the tracking circuit further comprises: a buffer having an input coupled to the output of the DAC; and a first switch coupled between an output of the buffer and the node.

Aspect 10: The PLL circuit of Aspect 9, wherein the tracking circuit further comprises a second switch coupled between the output of the buffer and the sample-and-hold circuit.

Aspect 11: The PLL circuit of any of Aspects 1 to 10, further comprising a low-pass filter coupled between the output of the charge pump and the control input of the VCO, wherein the node comprises an input of the low-pass filter.

Aspect 12: A radio frequency transceiver circuit comprising: a receive path; a receive phase-locked loop (Rx-PLL) coupled to the receive path; a transmit path; and a transmit phase-locked loop (TxPLL) coupled to the transmit path, wherein at least one of the RxPLL or the TxPLL comprises: a charge pump; a voltage-controlled oscillator (VCO) having a control input coupled to an output of the charge pump via a node; and a tracking circuit coupled to the node and configured to sample a voltage of the node during a mission mode, save a representation of the sampled voltage before entering a standby mode, and restore the sampled voltage to the node for reentering the mission mode using the saved representation of the sampled voltage.

Aspect 13: A method of wireless communication, comprising: operating a first phase-locked loop (PLL) during a first mission mode for a first circuit path associated with the first PLL; sampling a control voltage of the first PLL during the first mission mode; saving a representation of the sampled control voltage of the first PLL before entering a first standby mode for the first circuit path; stopping operation of at least a portion of the first PLL during the first standby mode; and restoring the sampled control voltage to the first PLL for reentering the first mission mode using the saved representation of the sampled control voltage of the first PLL.

Aspect 14: The method of Aspect 13, wherein the first circuit path comprises a receive path, wherein the first PLL comprises a receive phase-locked loop (RxPLL) and wherein the first mission mode is for reception of a downlink (DL) signal.

Aspect 15: The method of Aspect 13, wherein the first circuit path comprises a transmit path, wherein the first PLL comprises a transmit phase-locked loop (TxPLL), and wherein the first mission mode is for transmission of an uplink (UL) signal.

Aspect 16: The method of any of Aspects 13 to 15, further comprising converting the sampled control voltage of the first PLL with a successive-approximation register (SAR) analog-to-digital converter (ADC) to generate the representation of the sampled control voltage.

Aspect 17: The method of Aspect 16, wherein the SAR ADC comprises SAR logic and wherein saving the representation comprises saving a digital representation of the sampled control voltage of the first PLL in the SAR logic.

Aspect 18: The method of Aspect 17, wherein the SAR ADC further comprises a digital-to-analog converter (DAC) and wherein restoring the sampled control voltage to the first PLL comprises converting the digital representation of the sampled control voltage of the first PLL to an analog signal with the DAC.

Aspect 19: The method of Aspect 18, wherein restoring the sampled control voltage to the first PLL further comprises: buffering the analog signal; and using the buffered analog signal as the control voltage for restarting the first PLL to reenter the first mission mode.

Aspect 20: The method of any of Aspects 13 to 19, further comprising: operating a second PLL during a second mission mode for a second circuit path associated with the second PLL; sampling a control voltage of the second PLL during the second mission mode; saving a representation of the sampled control voltage of the second PLL for entering a second standby mode for the second circuit path; stopping operation of the second PLL during the second standby mode; and restoring the sampled control voltage to the second PLL for reentering the second mission mode using the saved representation of the sampled control voltage of the second PLL.

Aspect 21: The method of Aspect 20, wherein: the first circuit path comprises a receive path; the first PLL comprises a receive phase-locked loop (RxPLL); the first mission mode is for reception of a downlink (DL) signal; the second circuit path comprises a transmit path; the second PLL comprises a transmit phase-locked loop (TxPLL); and the second mission mode is for transmission of an uplink (UL) signal.

Aspect 22: The method of Aspect 20 or 21, wherein the first mission mode overlaps the second standby mode in time and/or wherein the second mission mode overlaps the first standby mode in time.

Aspect 23: An apparatus for wireless communication, comprising: a phase-locked loop (PLL) configured to operate during a mission mode for a circuit path associated with the PLL; means for sampling a control voltage of the PLL during the mission mode; means for saving a representation of the sampled control voltage of the PLL before entering a standby mode for the circuit path, wherein the PLL is further configured to stop operation during the standby mode; and means for restoring the sampled control voltage to the PLL for reentering the mission mode using the saved representation of the sampled control voltage.

Aspect 24: The apparatus of Aspect 23, further comprising means for converting the sampled control voltage of the PLL to generate the representation of the sampled control voltage.

Additional Considerations

Certain aspects of the present disclosure use a tuning voltage (Vtune) tracking circuit to assist a phase-locked loop (PLL) in locking quickly over temperature. The Vtune tracking circuit may measure and digitize Vtune and save the digital code before the PLL enters standby mode. When exiting standby mode, the Vtune tracking circuit restores the saved Vtune, and the PLL restarts in mission mode from the restored Vtune, which leads to a smaller initial PLL frequency error and a faster PLL settling.

The above description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components. For example, means for sampling may include at least a portion of a sample-and-hold circuit (e.g., the sample-and-hold circuit 604 of FIG. 6A). Means for converting may include an analog-to-digital converter (ADC) (e.g., the ADC 606 of FIG. 6A or the SAR ADC 611 of FIG. 6B). Means for saving may include memory or a register, such as the memory 608 of FIG. 6A or the SAR logic 614 of FIG. 6B. Means for restoring may include a digital-to-analog converter (DAC) (e.g., the DAC 610 of FIG. 6A or the DAC 616 of FIG. 6B), a buffer (e.g., the buffer 618 of FIG. 6B), and/or one or more switches (e.g., switch $S_3$ and $S_4$ of FIG. 6B).

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. A phase-locked loop (PLL) circuit comprising:
   a charge pump;
   a voltage-controlled oscillator (VCO) having a control input coupled to an output of the charge pump via a node; and
   a tracking circuit coupled to the node and configured to sample a voltage of the node during a mission mode, save a representation of the sampled voltage before entering a standby mode, and restore the sampled voltage to the node for reentering the mission mode using the saved representation of the sampled voltage, wherein the tracking circuit comprises a sample-and-hold circuit comprising a resistive element, a first switch, and a capacitive element coupled in series between the node and a reference potential node for the PLL circuit.

2. The PLL circuit of claim 1, wherein the PLL circuit comprises a receive phase-locked loop (RxPLL) and wherein the mission mode is for reception of a downlink (DL) signal.

3. The PLL circuit of claim 1, wherein the PLL circuit comprises a transmit phase-locked loop (TxPLL) and wherein the mission mode is for transmission of an uplink (UL) signal.

4. The PLL circuit of claim 1, wherein the sample-and-hold circuit further comprises a second switch coupled to a node between the first switch and the capacitive element.

5. The PLL circuit of claim 1, further comprising a low-pass filter coupled between the output of the charge pump and the control input of the VCO, wherein the node comprises an input of the low-pass filter.

6. A phase-locked loop (PLL) circuit comprising:
   a charge pump;
   a voltage-controlled oscillator (VCO) having a control input coupled to an output of the charge pump via a node; and
   a tracking circuit comprising a sample-and-hold circuit coupled to the node and configured to sample a voltage of the node during a mission mode, save a representation of the sampled voltage before entering a standby mode, and restore the sampled voltage to the node for reentering the mission mode using the saved representation of the sampled voltage, wherein the tracking circuit further comprises a successive-approximation register (SAR) analog-to-digital converter (ADC) having an input coupled to an output of the sample-and-hold circuit.

7. The PLL circuit of claim 6, wherein the SAR ADC further comprises:
   a comparator having a first input coupled to the output of the sample-and-hold circuit;
   SAR logic having an input coupled to an output of the comparator; and
   a digital-to-analog converter (DAC) having an input coupled to an output of the SAR logic and having an output coupled to a second input of the comparator.

8. The PLL circuit of claim 7, wherein the tracking circuit further comprises:
   a buffer having an input coupled to the output of the DAC; and
   a first switch coupled between an output of the buffer and the node.

9. The PLL circuit of claim 8, wherein the tracking circuit further comprises a second switch coupled between the output of the buffer and the sample-and-hold circuit.

10. A radio frequency transceiver circuit comprising:
    a receive path;
    a receive phase-locked loop (RxPLL) coupled to the receive path;
    a transmit path; and
    a transmit phase-locked loop (TxPLL) coupled to the transmit path, wherein at least one of the RxPLL or the TxPLL comprises:

a charge pump;

a voltage-controlled oscillator (VCO) having a control input coupled to an output of the charge pump via a node; and a tracking circuit coupled to the node and configured to sample a voltage of the node during a mission mode, save a representation of the sampled voltage before entering a standby mode, and restore the sampled voltage to the node for reentering the mission mode using the saved representation of the sampled voltage.

11. A method of wireless communication, comprising:

operating a first phase-locked loop (PLL) during a first mission mode for a first circuit path associated with the first PLL;

sampling a control voltage of the first PLL during the first mission mode;

saving a representation of the sampled control voltage of the first PLL before entering a first standby mode for the first circuit path;

stopping operation of at least a portion of the first PLL during the first standby mode; and restoring the sampled control voltage to the first PLL for reentering the first mission mode using the saved representation of the sampled control voltage of the first PLL, wherein the first circuit path comprises a receive path or a transmit path, wherein the first PLL comprises a receive phase-locked loop (RxPLL) or a transmit phase-locked loop (TxPLL), and wherein the first mission mode is for reception of a downlink (DL) signal or transmission of an uplink (UL) signal.

12. The method of claim 11, further comprising converting the sampled control voltage of the first PLL with a successive-approximation register (SAR) analog-to-digital converter (ADC) to generate the representation of the sampled control voltage.

13. The method of claim 12, wherein the SAR ADC comprises SAR logic and wherein saving the representation comprises saving a digital representation of the sampled control voltage of the first PLL in the SAR logic.

14. The method of claim 13, wherein the SAR ADC further comprises a digital-to-analog converter (DAC) and wherein restoring the sampled control voltage to the first PLL comprises converting the digital representation of the sampled control voltage of the first PLL to an analog signal with the DAC.

15. The method of claim 14, wherein restoring the sampled control voltage to the first PLL further comprises:

buffering the analog signal; and using the buffered analog signal as the control voltage for restarting the first PLL to reenter the first mission mode.

16. The method of claim 11, further comprising:

operating a second PLL during a second mission mode for a second circuit path associated with the second PLL;

sampling a control voltage of the second PLL during the second mission mode;

saving a representation of the sampled control voltage of the second PLL for entering a second standby mode for the second circuit path;

stopping operation of the second PLL during the second standby mode; and restoring the sampled control voltage to the second PLL for reentering the second mission mode using the saved representation of the sampled control voltage of the second PLL.

17. The method of claim 16, wherein:

the first circuit path comprises a receive path;

the first PLL comprises a receive phase-locked loop (RxPLL);

the first mission mode is for reception of a downlink (DL) signal;

the second circuit path comprises a transmit path;

the second PLL comprises a transmit phase-locked loop (TxPLL); and the second mission mode is for transmission of an uplink (UL) signal.

18. The method of claim 16, wherein the first mission mode overlaps the second standby mode in time and wherein the second mission mode overlaps the first standby mode in time.

\* \* \* \* \*